US006484278B1

(12) United States Patent
Merritt et al.

(10) Patent No.: US 6,484,278 B1
(45) Date of Patent: *Nov. 19, 2002

(54) METHOD AND APPARATUS FOR TESTING AN EMBEDDED DRAM

(75) Inventors: Todd A. Merritt; Donald M. Morgan; Huy Thanh Vo, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/573,074

(22) Filed: May 16, 2000

Related U.S. Application Data

(63) Continuation of application No. 09/130,632, filed on Aug. 6, 1998, now Pat. No. 6,072,737.

(51) Int. Cl.[7] .......................... G11C 29/00; G11C 7/00; G01R 31/28
(52) U.S. Cl. ........................ 714/719; 714/733; 365/201
(58) Field of Search ............................... 714/719, 733; 365/201

(56) References Cited

U.S. PATENT DOCUMENTS

| 4,882,708 A | | 11/1989 | Hayakawa et al. | 365/189.04 |
|---|---|---|---|---|
| 5,293,563 A | | 3/1994 | Ohta | 365/190 |
| 5,367,490 A | | 11/1994 | Kawamotot et al. | 365/201 |
| 5,404,335 A | | 4/1995 | Tobita | 365/222 |
| 5,568,437 A | * | 10/1996 | Jamal | 365/201 |
| 5,621,679 A | | 4/1997 | Seo et al. | 365/63 |
| 5,812,473 A | | 9/1998 | Tsai | 365/205 |
| 5,856,938 A | | 1/1999 | Kasai et al. | 365/149 |
| 5,909,404 A | * | 6/1999 | Schwarz | 365/201 |
| 6,034,900 A | | 3/2000 | Shirley et al. | 365/190 |
| 6,058,056 A | * | 5/2000 | Beffa et al. | 365/201 |
| 6,072,737 A | * | 6/2000 | Morgan et al. | 365/201 |

OTHER PUBLICATIONS

R. Torrance et al., "A 33GB/s 13.4Mb Integrated Graphics Accelerator and Frame Buffer," *IEEE International Solid-State Circuits Conference*; pp. 274, 275, 340, and 341, 1998.

(List continued on next page.)

*Primary Examiner*—Albert Decady
*Assistant Examiner*—Joseph D. Torres
(74) *Attorney, Agent, or Firm*—Dorsey & Whitney LLP

(57) ABSTRACT

A test circuit tests for defective memory cells in a memory portion of an Embedded DRAM. The Embedded DRAM includes an array of memory cells. The test circuit includes a test mode terminal adapted to receive a test mode signal and a plurality of comparison circuits. Each comparison circuit includes a first input adapted to receive a read data signal and a second input adapted to receive an expect data signal. Each comparison circuit compares the binary values of the read and expect data signals and develops and inactive error signal on an output when the compared signals have the same binary values, and develops an active error signal when the compared signals have different binary values. A storage circuit is coupled to the outputs of the comparison circuits. The storage circuit latches the error signals output by the comparison circuits and sequentially transfers the latched error signals onto a data terminal of the Embedded DRAM. A test control circuit is coupled to the comparison circuits, the test mode termninal, and the storage circuit. The test control circuit operates when the test mode signal is active, to apply data from addressed memory cells respectively on the first inputs of the comparison circuits. The test control circuit also applies respective expect data on the second inputs of the comparison circuits and controls the storage circuit to latch the resulting error signals and thereafter sequentially transfer the latched error signals onto the data terminal. The test circuit may include additional stages of comparison circuits to further compress read test data, as well as additional storage circuits for storing such additional compressed data.

36 Claims, 7 Drawing Sheets

OTHER PUBLICATIONS

J. Dreibelbis et al., "An ASIC Library Granular DRAM Macro with Built–In Self Test," *IEEE International Solid–State Circuits Conference;* pp. 58, 59, 74, and 75, 1998.

T. Yabe et al., "A Configurable DRAM Macro Design for 2112 Derivative Organizations to be Synthesized Using a Memory Generator," *IEEE International Solid–State Circuits Conference;* pp. 56, 57, 72, and 73, 1998.

* cited by examiner

METHOD AND APPARATUS FOR TESTING AN EMBEDDED DRAM

CROSS-REFERENCE TO RELATED APPLICATION

This application is a continuation of U.S. patent application Ser. No. 09/130,632, filed Aug. 6, 1998 now U.S. Pat. No. 6,072,737.

TECHNICAL FIELD

The present invention relates generally to semiconductor memories, and more specifically to a method and circuit for testing an Embedded DRAM including memory and logic circuitry formed in a single integrated circuit.

BACKGROUND OF THE INVENTION

Advances in the design and fabrication of integrated circuits have resulted in significant decreases in the size of transistors and other components forming such integrated circuits. Accordingly, the density of transistors and other components that may be formed in a semiconductor substrate of a given size has increased dramatically. Such dramatic increases in the density of components have enabled manufacturers to fabricate high capacity memory devices in the same size substrate previously required for much lower capacity devices. Similarly, for microprocessors and other logic circuits, such increased component density has enabled manufacturers to increase functionality by including additional circuitry on the substrate.

In addition to improving functionality and performance of existing types of integrated circuits, increased component density has enabled manufacturers to develop a new type of integrated circuit called an "Embedded DRAM" in which logic circuitry and dynamic random access memory ("DRAM"), or other type of memory, are formed in the same integrated circuit. In other words, the logic circuitry may be "embedded" in the DRAM. FIG. 1 is a block diagram of an Embedded DRAM 11 including logic circuitry 13 and a DRAM 15 formed in a semiconductor substrate 17. The logic circuitry 13 may be designed to perform a specific function, or may be more general purpose circuitry, such as a microprocessor performing a variety of different tasks. The logic circuitry 13 is coupled to the DRAM 15 through an address bus 19, internal data bus 21, and control bus 23, and applies address, data, and control signals on these respective busses to transfer data to and from the DRAM 15. The logic circuitry 13 is further coupled to external terminals 25 on which the logic circuitry transfers information to and from external circuits (not shown in FIG. 1) coupled to the Embedded DRAM 11.

In the Embedded DRAM 11, forming the logic circuitry 13 and the DRAM 15 in the same semiconductor substrate 17 yields numerous performance benefits. First, the bandwidth of the DRAM 15 may be substantially increased by increasing the width N of the internal data bus 21, where N may be 128, 256, or 512 bits, or even wider. As understood by one skilled in the art, increasing the width N of the internal data bus 21 increases the bandwidth of the DRAM 15 by enabling more data to be transferred during each access of the DRAM 15. In a conventional DRAM, an external data bus of the DRAM has a width that is limited by a number of factors, including the number of pins that can physically be formed on a package containing the DRAM and noise generated by switching multiple data lines in parallel, as understood by one skilled in the art. In contrast, the internal data bus 21 of the Embedded DRAM 11 requires no external pins, but is instead directly connected to the logic circuitry 13 through traces formed on the substrate 17. Thus, the width N may be very wide which, in turn, dramatically increases the bandwidth of the DRAM 15.

Additional advantages of the Embedded DRAM 11 over conventional discreet interconnected devices include lower power consumption and lower electromagnetic radiation due to the shorter lengths of conductive traces comprising the internal data bus 21. Furthermore, transmission line effects such as propagation delays are likewise alleviated due to such reduced lengths of the internal data bus 21. The shorter line lengths and corresponding reduced capacitance of individual lines in the bus 21 also reduce the noise resulting when switching the N lines in parallel.

In one application of the Embedded DRAM 11, the logic circuitry 13 is a microprocessor and the DRAM 15 is directly coupled to the microprocessor via the internal data bus 21. As understood by one skilled in the art, a memory controller is typically required between a conventional DRAM and a microprocessor because the DRAM has a much lower bandwidth than the processor. Thus, a conventional DRAM creates a "bandwidth bottleneck" that limits the speed at which a computer system including the DRAM and the processor can execute a program. In contrast, in the Embedded DRAM 11 the internal data bus 21 provides a very high bandwidth between the processor 13 and DRAM 15, making the Embedded DRAM 11 well suited to applications requiring very high bandwidths, such as networking, multimedia, and high-resolution graphics systems.

During the manufacture of the Embedded DRAM 11, the DRAM 15 needs to be tested just as with conventional DRAMs. Testing the DRAM 15, however, presents new problems not encountered when testing conventional DRAMs. More specifically, an external memory tester (not shown in FIG. 1) must transfer test data to and from the memory cells in the DRAM 15. The memory tester must be coupled to the DRAM 15 through the external terminals 25 on the Embedded DRAM 11, and must apply address, control, and data signals on such external terminals to transfer data to and from the memory cells in the DRAM 15. Due to the wide internal data bus 21 of the DRAM 15, however, there are many fewer external terminals 25 available on the Embedded DRAM 11 than there are data lines in the internal data bus 21. For example, if the internal data bus 21 is 512 bits wide, the Embedded DRAM 11 cannot include 512 external data terminals plus address and control terminals due to the physical limitations of forming such external terminals 25. Thus, in an Embedded DRAM there is a problem in transferring data between the DRAM and the memory tester in order to test the DRAM.

There is a need for a test circuit in an Embedded DRAM that enables a memory tester to test the DRAM portion of the Embedded DRAM.

SUMMARY OF THE INVENTION

The present invention relates to a method and apparatus for testing a memory portion of an Embedded DRAM. According to one inventive aspect of the present invention, a test circuit comprises a test mode terminal adapted to receive a test mode signal and a plurality of first-stage comparison circuits. Each first-stage comparison circuit includes a first input adapted to receive a read data signal and a second input adapted to receive an expect data signal. Each first-stage comparison circuit compares the binary values of the read and expect data signals and develops an inactive first-stage error signal on an output when the compared signals have the same binary values. When the compared signals have different binary values, each first-stage comparison circuit develops an active first-stage error signal on the output. A storage circuit is coupled to the outputs of the first-stage comparison circuits, and latches the first-stage error signals output by the first-stage comparison circuits. The storage circuit sequentially transfers the latched first-stage error signals onto a data terminal of the Embedded DRAM. A test control circuit is coupled to the first-stage comparison circuits, the test mode terminal, and the storage circuit. The test control circuit operates responsive to the test mode signal being active to apply data from addressed memory cells respectively on the first inputs of the first-stage comparison circuits. The test control circuit also applies respective expect data on the second inputs of the first-stage comparison circuits. The test control circuit controls the storage circuit to latch the resulting first-stage error signals and thereafter sequentially transfer the latched first-stage error signals onto the data terminal.

According to another inventive aspect of the present invention, the test circuit includes a second-stage comparison circuit coupled to the storage circuit and to an external terminal of the Embedded DRAM. The second-stage comparison circuit develops an active second-stage error signal on the external terminal when at least one of the first-stage error signals stored in the storage circuit is active. A test control circuit controls the first-stage and second-stage comparison circuits and the storage circuit in response to the test mode signal. When the test mode signal is active, the test control circuit applies data from addressed memory cells respectively on the first inputs of the first-stage comparison circuits and applies respective expect data on the second inputs of the first-stage comparison circuits. The test control circuit controls the storage circuit to latch the resulting first-stage error signals and the second-stage comparison circuit to develop the second-stage error signal on the external terminal.

Another inventive aspect of the present invention includes the test circuit further having a second storage circuit coupled to an external terminal of the Embedded DRAM and to the second-stage comparison circuit. The second storage circuit latches second-stage error signals output by the second-stage comparison circuit and sequentially transfers the latched second-stage error signals onto the external terminal of the Embedded DRAM. A test control circuit controls the first-stage and second-stage comparison circuits, and the first and second storage circuits responsive to the test mode signal. When the test mode signal is active, the control circuit applies data from a group of memory cells respectively on the first inputs of the first-stage comparison circuits and applies expect data on the respective second inputs of the first-stage comparison circuits. The test control circuit controls the first-stage storage circuit to latch the resulting first-stage error signals, and the second-stage comparison circuit to develop the second-stage error signal. The control circuit then controls the second storage circuit to latch the second-stage error signal output by the second-stage comparison circuit. The test control circuit accesses a plurality of groups of memory cells such that the second storage circuit stores a plurality of second-stage error signals. The control circuit thereafter controls the second storage circuit to sequentially transfer the stored second-stage error signals onto the external terminal.

DETAILED DESCRIPTION OF THE INVENTION

Figure 2:
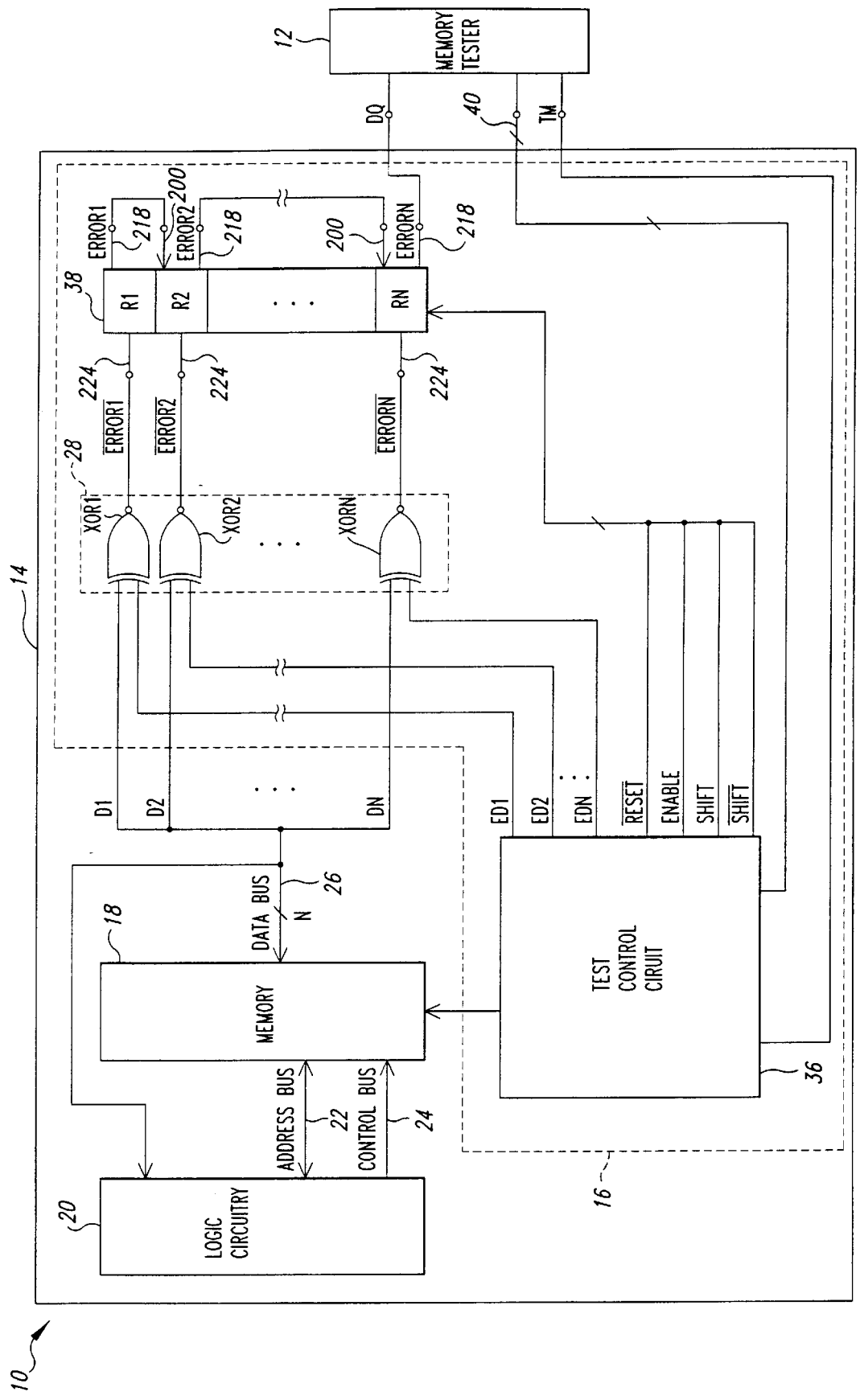
FIG. 2 is a functional block diagram of a test system including an Embedded DRAM having a test circuit according to one embodiment of the present invention.

FIG. 2 is a functional block diagram of a test system 10 including a memory tester 12 coupled to an Embedded DRAM 14. The Embedded DRAM 14 includes a memory 18 coupled to a test circuit 16 that transfers addressed data stored in the memory 18 to the memory tester 12 during a test mode of operation, as will be explained in more detail below.

The Embedded DRAM 14 includes logic circuitry 20 that may be dedicated circuitry designed to perform a specific function, or more general purpose circuitry, such as a microprocessor executing a variety of tasks. The logic circuitry 20 applies address, control, and data signals on address, control, and data busses 22, 24, and 26, respectively, to transfer data to and from the memory 18. The memory 18 is typically DRAM memory, although SRAM or other types of memory may be utilized. The data bus 26 of the memory 18 is N bits wide, and accordingly includes N lines carrying respective data signals designated D1–DN. Typically, the value of N depends on the architecture of the memory 18. For example, the memory 18 may include a plurality of memory cell arrays, each array including 128 columns of memory cells. In this situation, N may equal 128 such that the data stored in an activated row of memory cells is placed on the data bus 26.

The data bus 26 is further coupled to a comparison circuit 28 including N XOR gates designated XOR1–XORN. The gates XOR1–XORN receive the data signals D1–DN, respectively, on respective first inputs, and receive expect data signals ED1–EDN, respectively, on second inputs. In operation, the gates XOR1–XORN develop error signals $\overline{ERROR1}$–$\overline{ERRORN}$ on their outputs, respectively, in response to the binary values of the corresponding data and expect data signals received on their inputs. For example, the gate XOR1 compares the binary values of the data signal D1 and the expect data signal ED1 and develops the error signal $\overline{ERROR1}$ in response to these compared signals. When the data signal D1 and the expect data signal ED1 are either both high or both low, the gate XOR1 drives the error signal $\overline{ERROR1}$ inactive high. When the signals D1 and ED1 have different binary values, the gate XOR1 drives the error signal $\overline{ERROR1}$ active low. A test control circuit 36 develops the expect data signals ED1–EDN, along with a number of other signals utilized in controlling the test circuit 16, as will be explained in more detail below.

The error signals $\overline{ERROR1}$–$\overline{ERRORN}$ developed by the gates XOR1–XORN, respectively, are applied to a shift register circuit 38. The shift register circuit 38 further receives control signals $\overline{\text{RESET}}$, ENABLE, SHIFT, and $\overline{\text{SHIFT}}$ developed by the test control circuit 36. In response to these control signals, the shift register circuit 38 latches the error signals $\overline{\text{ERROR1}}$–$\overline{\text{ERRORN}}$, complements the latched signals to develop the signals ERROR1–ERRORN, respectively, and thereafter serially transfers the error signals ERROR1–ERRORN onto a data terminal DQ, as will be explained in more detail below.

The shift register circuit 38 includes a plurality of individual registers R1–RN receiving the error signals $\overline{\text{ERROR1}}$–$\overline{\text{ERRORN}}$, respectively, on corresponding data inputs 224. The registers R1–RN include respective shift outputs 218 on which they output the complementary error signals ERROR1–ERRORN, respectively. The shift output 218 of each of the registers R1–RN is coupled to a shift input 200 of the adjacent register as shown. The register R1 does not have a shift input 200 and the register RN has its shift output 218 coupled to the external data terminal DQ.

Figure 3:
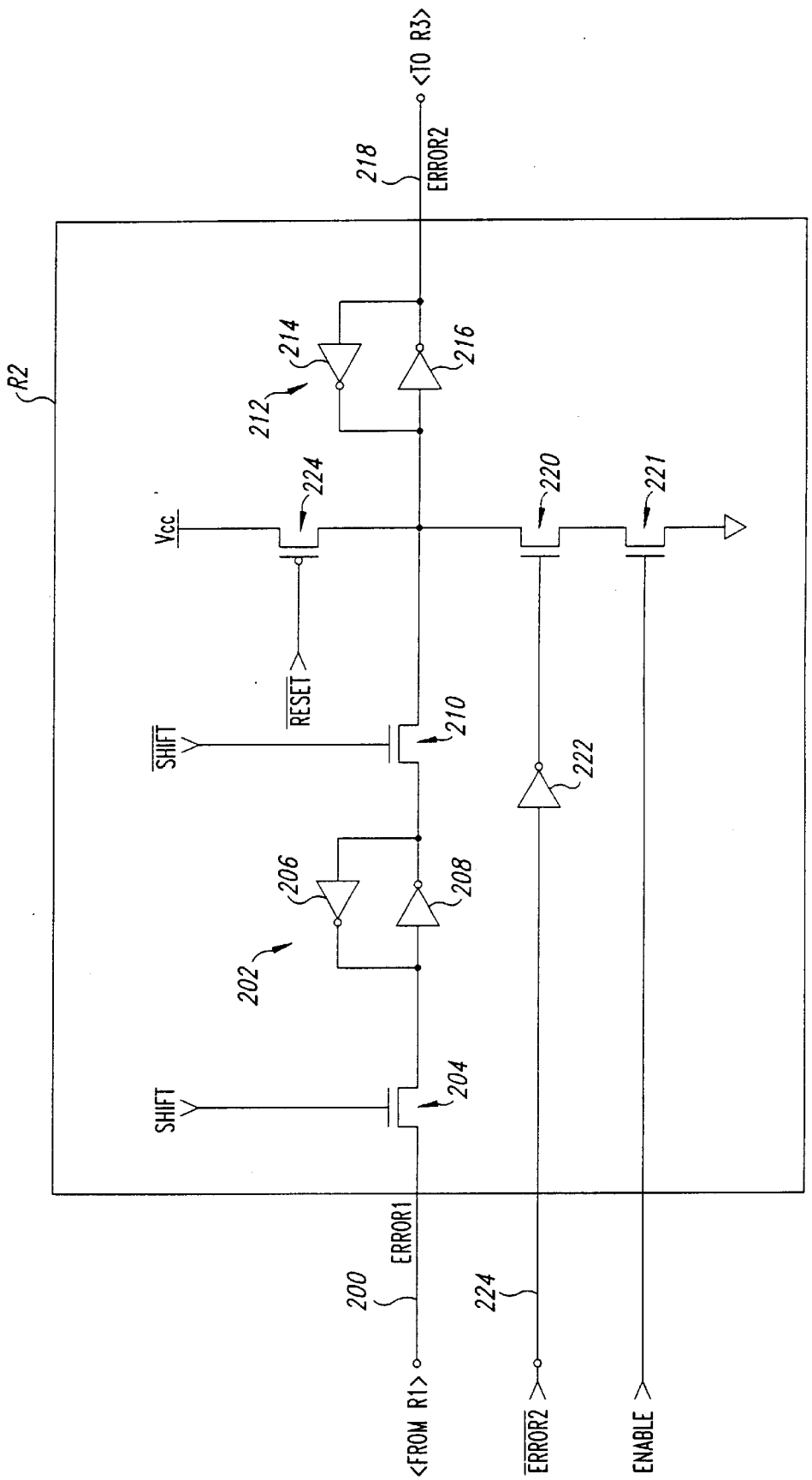
FIG. 3 is a schematic of one embodiment of an individual register in the shift register circuit of FIG. 2.

FIG. 3 is a more detailed schematic of the register R2 in the shift register circuit 38. All the registers R1–RN are identical, and thus, for the sake of brevity, only the register R2 will be described in more detail. The register R2 includes the shift input 200 coupled to an input of a latch circuit 202 through an NMOS transistor 204 receiving the signal SHIFT on its gate. The latch circuit 202 includes a pair of cross-coupled inverters 206 and 208 that latch the input to the logic level of a signal applied on the input and an output to the complementary logic level. An NMOS transistor 210 couples the output of the latch circuit 202 to an input of a second latch circuit 212 in response to the signal $\overline{\text{SHIFT}}$ received on its gate. The latch circuit 212 includes a pair of cross-coupled inverters 214 and 216, and operates in the same way to latch its input to the logic level of a signal applied on the input and drives the error signal ERROR2 on the shift output 218 to the complementary logic level. A pair of NMOS transistors 220 and 221 are coupled in series between the input of the latch circuit 212 and ground. The register R2 receives the error signal $\overline{\text{ERROR2}}$ on a data input 224, and this signal is applied through an inverter 222 to the gate of the transistor 220. An enable signal ENABLE is applied to the gate of the transistor 221. The input of the latch circuit 212 is also coupled to a supply voltage source $V_{CC}$ through a PMOS transistor 224 receiving the signal $\overline{\text{RESET}}$ on its gate.

The register R2 operates in one of three modes, a reset mode, a parallel-storage mode, and a serial-transfer mode. The reset mode is characterized by the reset signal $\overline{\text{RESET}}$ going active low, the signals SHIFT and $\overline{\text{SHIFT}}$ both being low, and the signal ENABLE being inactive low. In response to the active reset signal $\overline{\text{RESET}}$, the transistor 224 turns ON, driving the input of the latch circuit 212 to approximately the supply voltage $V_{CC}$ and causing the latch circuit 212, in turn, to latch its input high and the signal ERROR2 inactive low. In the reset mode, the transistors 204, 210, and 221 are turned OFF in response to the signals SHIFT, $\overline{\text{SHIFT}}$, and ENABLE, respectively.

After the reset mode, the register R2 operates in the parallel-storage mode. In the parallel-storage mode, the signals SHIFT and $\overline{\text{SHIFT}}$ are once again low, turning OFF the transistors 204 and 210, respectively, and the signal $\overline{\text{RESET}}$ is high, turning OFF the transistor 224. During the parallel-storage mode, the signal ENABLE is active high and the latch circuit 212 latches the error signal $\overline{\text{ERROR2}}$ to the complement of the error signal $\overline{\text{ERROR2}}$. More specifically, when the error signal $\overline{\text{ERROR2}}$ is inactive high, the inverter 222 drives its output low turning OFF the transistor 220. Thus, when the error signal $\overline{\text{ERROR2}}$ is inactive high, the transistor 220 does not turn ON and the latch circuit 212 maintains the error signal ERROR2 low, which is the level to which it was set during the reset mode. If the error signal $\overline{\text{ERROR2}}$ goes active low, the inverter 222 drives its output high turning ON the transistor 220 which, in turn, drives the input of the latch circuit 212 low through the activated transistors 220, 221. In response to the low on its input, the latch circuit 212 latches its input low and the error signal ERROR2 high. In this way, when the error signal $\overline{\text{ERROR2}}$ goes active low, the latch circuit 212 latches the error signal ERROR2 active high. The parallel-storage mode of operation is terminated by driving the signal ENABLE inactive low.

The register R2 operates in the serial-transfer mode after operation in the parallel-storage mode. In the serial-transfer mode, the register R2 shifts data placed on the shift input 200 to the shift output 218 in response to the shift signals SHIFT and $\overline{\text{SHIFT}}$. For the following description, assume the signal ERROR1 on the input 200 is low, the signals SHIFT and $\overline{\text{SHIFT}}$ are initially low, and the signal ERROR2 is initially high. The test control circuit 36 (see FIG. 2) thereafter drives the shift signals SHIFT and $\overline{\text{SHIFT}}$ high and low, respectively, turning ON the transistor 204 and turning OFF the transistor 210. When the signal SHIFT goes high, the transistor 204 turns ON, applying the low signal ERROR1 to the input of the latch circuit 202, which, in turn, causes the latch circuit 202 to drive its input low and its output high. At this point, the output of the latch circuit 202 is isolated from the input of the latch circuit 212 by the transistor 210 which is turned OFF. The control circuit 36 then drives the shift signals SHIFT and $\overline{\text{SHIFT}}$ low and high, respectively, turning OFF the transistor 204 and turning ON the transistor 210. When the transistor 210 turns ON, the high output of the latch circuit 202 is coupled to the input of the latch circuit 212, causing the latch circuit to drive its input high and the signal on the shift output 218 low corresponding to the error signal ERROR1 applied on the shift input 200. In this way, the control circuit 36 develops the shift signals SHIFT, $\overline{\text{SHIFT}}$ to shift the error signal ERROR1 applied on the shift input 200 to the shift output 218. Referring back to FIG. 2, the control circuit 36 applies the shift signals SHIFT, $\overline{\text{SHIFT}}$ to the registers R1–RN to shift the signals ERROR1–ERRORN sequentially onto the data terminal DQ. The signal ERRORN is first placed on the terminal DQ, then the signal ERRORN–1, and so on until the signal ERROR1 is placed on the terminal DQ.

The overall operation of the test circuit 16 during testing of the memory 18 will now be described in more detail with reference to FIG. 2. To place the Embedded DRAM 14 in a test mode of operation, the memory tester 12 activates a test mode signal TM. The test mode signal TM may take a variety of forms, such as a logic level or super voltage applied on a single external terminal of the Embedded DRAM 14. Alternatively, the signal TM may include a plurality of signals applied on respective external terminals of the Embedded DRAM 14, with the signals being driven to specific logic levels or activated in a particular sequence. In response to the activated test mode signal TM, the control circuit 36 operates in a test write mode to write a test data pattern to the memory cells in the memory 18. During the write test mode, the control circuit 36 may itself generate the test data pattern, or the memory tester 12 may apply the test data on the terminals 40 of the Embedded DRAM 14. The method of writing the test data into the memory 18 is not an integral part of the test circuit 16, and thus, for the sake of brevity, will not be further described. The control circuit 36 may also utilize data compression circuitry to write test data placed on a single data terminal DQ into a plurality of memory cells in the memory 18, as understood by one skilled in the art.

After the desired test data has been written to the memory 18, the memory tester 12 applies control signals on the terminals 40 to activate the test circuit 16 in a test read mode of operation. In the test read mode, the test control circuit 36 initially drives the shift signals SHIFT and $\overline{\text{SHIFT}}$ and enable signal ENABLE low, and pulses the reset signal $\overline{\text{RESET}}$ active low, resetting the error signals ERROR1–ERRORN stored in the registers R1–RN, respectively, inactive low. After resetting the registers R1–RN, the test control circuit 36 applies address and control signals to access addressed groups of memory cells in the memory 18. Each group includes N memory cells such that data signals D1–DN corresponding to the group are placed on the respective lines of the data bus 26. The data stored in the addressed group of memory cells is transferred across the data bus 26 and applied to the comparison circuit 28. After the data stored in the addressed group of memory cells is applied to the comparison circuit 28, the test control circuit 36 applies conesponding expect data signals ED1–EDN to the comparison circuit 28. At this point, each of the gates XOR1–XORN in the comparison circuit 28 compares the binary values of the associated one of the data signals D1–DN to the associated one of the expect data signals ED1–EDN, and develops the corresponding one of the error signals $\overline{\text{ERROR1–ERRORN}}$. For example, the gate XOR2 compares the binary values of the data signal D2 and the expect data signal ED2, and develops the error signal $\overline{\text{ERROR2}}$ in response to these binary values.

Once the comparison circuit 28 develops the error signals $\overline{\text{ERROR1–ERRORN}}$, the test control circuit 36 activates the enable signal ENABLE and the shift register circuit 38 latches the error signals $\overline{\text{ERROR1–ERRORN}}$ as the complementary error signals ERROR1–ERRORN, respectively, as previously described. More specifically, each of the registers R1–RN receiving an active low one of the error signals $\overline{\text{ERROR1–ERRORN}}$ latches the corresponding complemented error signal ERROR1–ERRORN active high, and each of the registers R1–RN receiving an inactive high one of the error signals $\overline{\text{ERROR1–ERRORN}}$ latches the corresponding complemented error signal ERROR1–ERRORN inactive low. After the shift register circuit 38 has latched the error signals ERROR1–ERRORN developed in response to a first group of addressed memory cells, the control circuit 36 deactivates the enable signal ENABLE.

Figure 1:
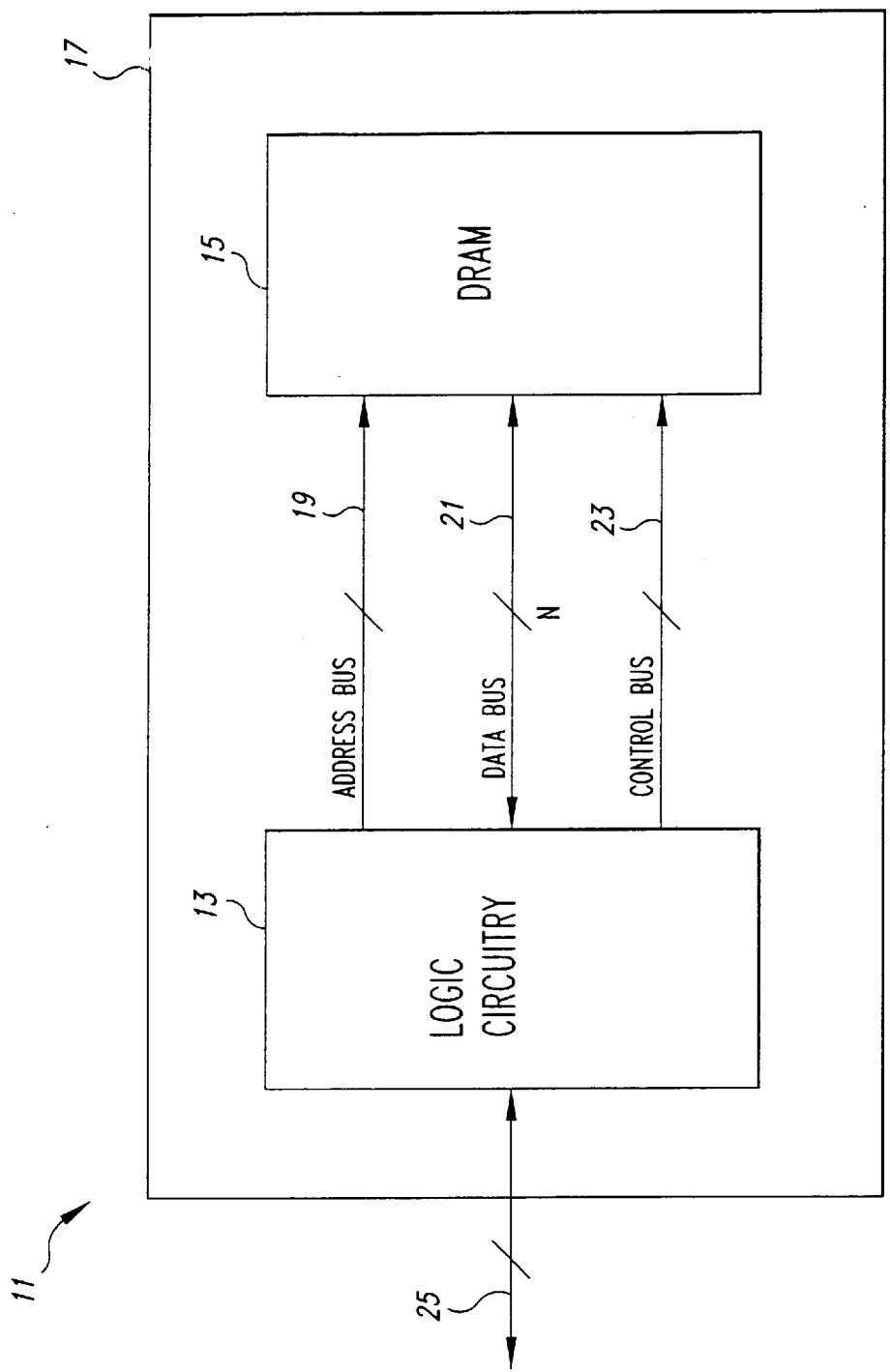
FIG. 1 is a functional block diagram of a conventional Embedded DRAM.

The test control circuit 36 thereafter develops the shift signals SHIFT and $\overline{\text{SHIFT}}$ to serially transfer the error signals ERROR1–ERRORN stored in the registers R1–RN, respectively, onto the data terminal DQ. In the embodiment of FIG. 1, the error signal ERRORN is placed on the terminal DQ first, then the error signal ERRORN–1, and so on until the error signal ERROR1 is shifted onto the terminal DQ. The memory tester 12 monitors the error signals ERROR1–ERRORN serially placed on the data terminal DQ and determines an addressed memory cell is defective when the corresponding one of the error signals ERROR1–ERRORN is active. Once the memory tester 12 has received all the error signals ERROR1–ERRORN, the control circuit 36 once again deactivates the enable signal ENABLE and pulses the reset signal $\overline{\text{RESET}}$ active low, resetting the registers R1–RN in the shift register circuit 38. The test circuit 16 thereafter operates in the same way to address a second group of memory cells in the memory 18, and transfer error signals ERROR1–ERRORN corresponding to the second group of memory cells to the memory tester 12. The test circuit 16 continues this process until all the memory cells in the memory 18 have been tested.

In the test circuit 16, the control circuit 36 may wait until the error signals ERROR1–ERRORN corresponding to a particular group of memory cells have been serially shifted out of the shift register circuit 38 before accessing a second group of memory cells in the memory 18. Alternatively, the control circuit 36 may initiate accessing a second group of memory cells in the memory 18 while the error signals ERROR1–ERRORN are being serially shifted out of the shift register circuit 38. In this way, the test time of the Embedded DRAM 14 may be reduced by accessing a second group of memory cells in the memory 18 while the error signals ERROR1–ERRORN associated with a first group of memory cells are being shifted out of the Embedded DRAM 14 on the data terminal DQ. In the embodiment of FIG. 2, the control circuit 36 must maintain the signal ENABLE inactive until the error signals ERROR1–ERRORN corresponding to a first group of addressed memory cells are entirely shifted out of the shift register circuit 38. If the signal ENABLE is activated earlier, error signals $\overline{\text{ERROR1–ERRORN}}$ corresponding to a second group of addressed memory cells could overwrite data stored in the registers R1–RN. Alternative embodiments of the comparison circuit 28 and shift register circuit 38 may be utilized, as will be understood by one skilled in the art.

Figure 4:
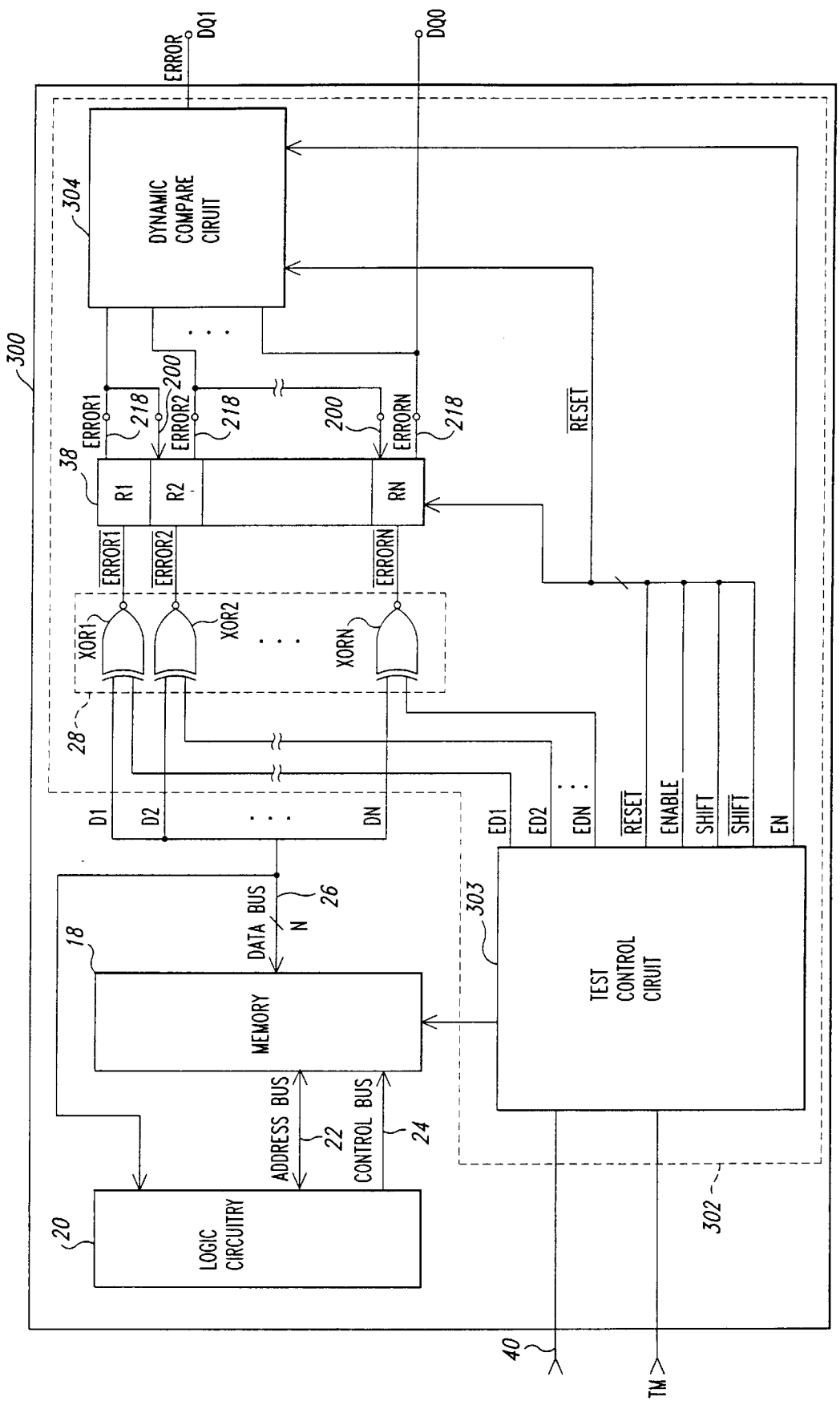
FIG. 4 is a functional block diagram of an Embedded DRAM including a test circuit according to another embodiment of the present invention.

FIG. 4 is a functional block diagram of an Embedded DRAM 300 including a test circuit 302 according to a second embodiment of the present invention. In the Embedded DRAM 300 and test circuit 302, components that are the same as those previously described with reference to FIG. 2 have been given the same reference numerals and, for the sake of brevity, will not be described in further detail. The test circuit 302 is the same as the previously described test circuit 16 except for a test control circuit 303 and a dynamic compare circuit 304 coupled between the shift register circuit 38 and an external terminal DQ1 of the Embedded DRAM 300. The compare-circuit 304 develops an error signal ERROR on the data terminal DQ1 in response to the error signal ERROR1–ERRORN received from the shift register circuit 38, as will now be described in more detail.

Figure 5:
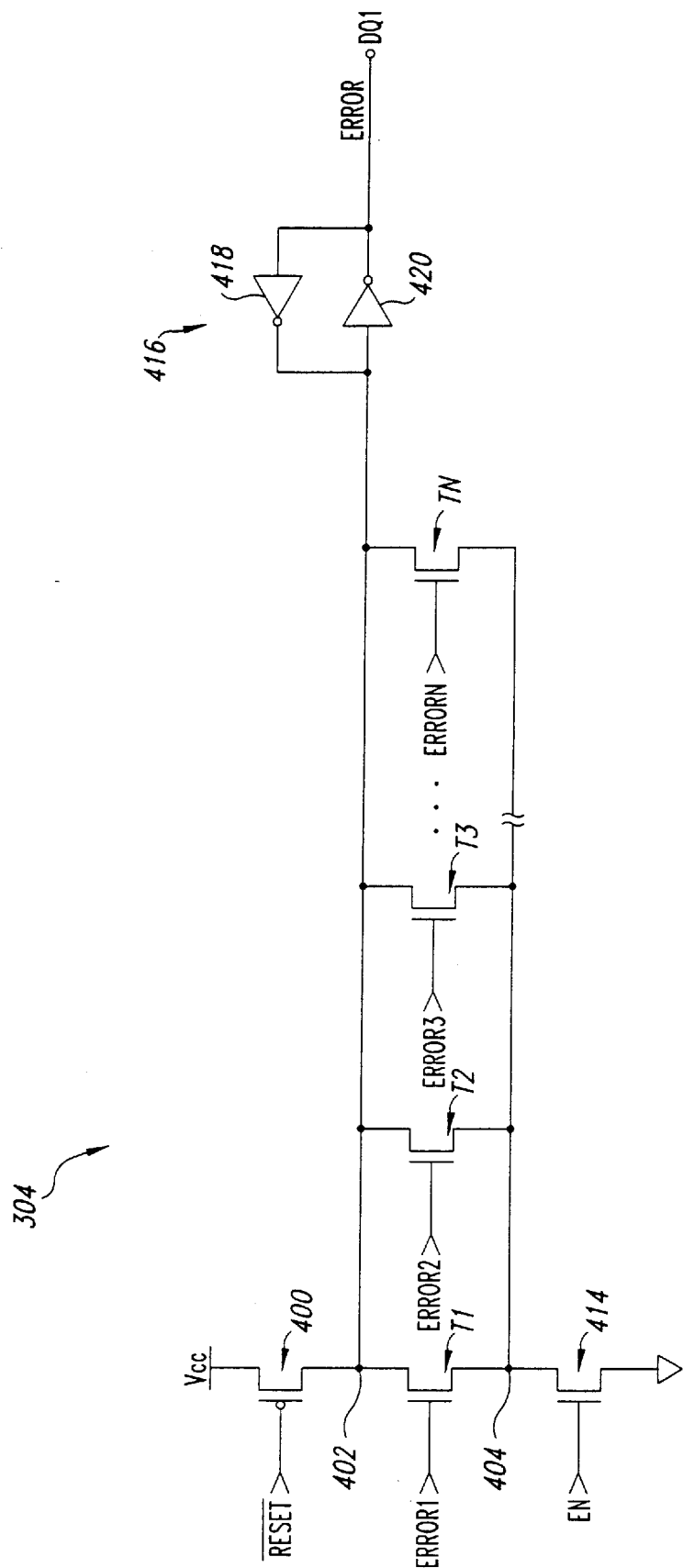
FIG. 5 is a schematic of one embodiment of the dynamic compare circuit of FIG. 4.

FIG. 5 is a schematic of one embodiment of the dynamic compare circuit 304 of FIG. 4. The compare circuit 304 includes a PMOS transistor 400 coupled between the supply voltage source $V_{CC}$ and an activation node 402. The transistor 400 couples the activation node 402 to the supply voltage source $V_{CC}$ in response to the reset signal $\overline{\text{RESET}}$ received on its gate. The compare circuit 304 further includes N compare transistors T1–TN coupled between the activation node 402 and a reference node 404. The compare transistors T1–TN receive on their gates the error signals ERROR1–ERRORN, respectively. An NMOS enable transistor 414 couples the reference node 404 to ground in response to an enable signal EN received on its gate. The compare circuit 304 further includes a latch 416 formed from a pair of cross-coupled inverters 418 and 420 coupled between the activation node 402 and the external data terminal DQ1. The latch 416 latches its input to the logic level of the signal on the activation node 402, and latches the error signal ERROR on its output to the complementary logic level.

In operation, the compare circuit 304 activates the error signal ERROR on the terminal DQ1 when any of the signals ERROR1–ERRORN is active, as will now be explained in more detail. The compare circuit 304 operates in one of three modes, a standby mode, a reset mode, and a compare mode.

In the standby mode, the reset signal $\overline{\text{RESET}}$ is inactive high and the enable signal EN is inactive low. In response to the low signal EN, the transistor 414 turns OFF isolating the reference node 404 from ground and thereby deactivating the compare circuit 304. In the reset mode, the reset signal $\overline{\text{RESET}}$ goes low driving the activation node 402 to approximately the supply voltage $V_{CC}$ through the turned ON transistor 400. In response to the activation node 402 going high, the latch 416 latches its input high and the error signal ERROR inactive low. After the latch 416 latches its input high and the signal ERROR low, the reset signal RESET goes high turning OFF the transistor 400 and terminating the reset mode of operation. One skilled in the art will realize the reset circuit 304 is not truly "dynamic" because the latch 416 drives the activation node 402 after the reset mode.

In the compare mode of operation, the enable signal EN and reset signal $\overline{\text{RESET}}$ are active high and inactive high, respectively, and the error signals ERROR1–ERRORN are applied to the gates of the compare transistors T1–TN, respectively. If any of the applied error signals ERROR1–ERRORN is active high, the corresponding one of the compare transistors T1–TN turns ON coupling the activation node 402 to approximately ground through the activated compare transistor and enable transistor 414. For example, when the error signal ERROR1 is high, the compare transistor T1 turns ON coupling the activation node 402 to approximately ground through the transistors T1 and 414. In this way, if any of the error signals ERROR1–ERRORN is active, the activation node 402 goes low causing the latch 416 to latch its input low and the error signal ERROR active high.

Referring back to FIG. 4, the overall operation of the test circuit 302 in testing the memory 18 will now be described. The memory tester 12 (not shown in FIG. 4) places the test circuit 302 in the test mode by activating the test mode signal TM. After the test mode signal TM is activated, the test control circuit 303 operates as previously described to write test data into all the memory cells in the memory 18. The test control circuit 303 thereafter pulses the reset signal $\overline{\text{RESET}}$ active low, and drives the signals ENABLE and EN inactive low and the signals SHIFT, $\overline{\text{SHIFT}}$ both low. In response to the reset signal $\overline{\text{RESET}}$ going low, the shift register circuit 38 drives the error signals ERROR1–ERRORN inactive low, and the compare circuit 304 likewise drives the error signal ERROR on the terminal DQ1 inactive low.

After pulsing the reset signal $\overline{\text{RESET}}$ low, the control circuit 36 activates the enable signal EN which, in turn, enables the compare circuit 304. It should be noted that at this point all the error signals ERROR1–ERRORN output by the shift register circuit 38 are low turning OFF all the compare transistors T1–TN in the compare circuit 304. The control circuit 303 then operates as previously described to access a first group of memory cells in the memory 18 and apply the corresponding data signals D1–DN and expect data signals ED1–EDN to the comparison circuit 28. The shift register circuit 38 then stores the error signals ERROR1–ERRORN, and applies the stored error signals ERROR1–ERRORN to the compare circuit 304. When any of the error signals ERROR1–ERRORN is active, the compare circuit 304 drives the signal ERROR active high indicating one of the memory cells in the addressed first group is defective. The memory tester 12 monitors the signal ERROR on the terminal DQ1 to determine whether any of the addressed memory cells is defective.

At this point, the test circuit 302 may operate in two different ways. First, the control circuit 303 may apply address and control signals to the memory 18 to access a second group of memory cells and develop the signals $\overline{\text{RESET}}$, ENABLE, and EN to control the circuits 28, 38, and 304 such that the compare circuit 304 places a new error signal ERROR on the terminal DQ1 corresponding to the second group of addressed memory cells. Once again, the memory tester 12 monitors the signal ERROR to determine whether any of the memory cells in the second addressed group is defective. The test circuit 302 operates in the same way to sequentially develop a plurality of error signals ERROR, one for each group of memory cells in the memory 18. Alternatively, whenever the memory tester 12 determines the error signal ERROR is active, the memory tester 12 may then apply signals on the terminal 40 causing the control circuit 303 to develop the signals SHIFT and $\overline{\text{SHIFT}}$ to serially shift the error signals ERROR1–ERRORN stored in the shift register circuit 38 onto the data terminal DQ0 as previously described.

The test circuit 302 enables the memory tester 12 to more quickly test the memory cells in the memory 18. This is true because the test circuit 302 first determines whether a group of addressed memory cells contains a defective memory cell and only when such a defective memory cell is detected are the error signals ERROR1–ERRORN serially shifted out of the Embedded DRAM 300. When an addressed group of memory cells in the memory 18 includes no defective memory cells, the error signals ERROR1–ERRORN corresponding to that group need not be shifted out of the Embedded DRAM 300. Thus, the time it takes to serially shift the error signals ERROR1–ERRORN out of the Embedded DRAM 300 on the terminal DQ0 need not be wasted unless one of the corresponding memory cells is defective.

One skilled in the art will realize the precise sequence of operation of the test circuit 302 may be varied. For example, the test circuit 303 may first place the error signals ERROR on the terminal DQ1 for every group of memory cells in the memory 18. The memory tester 12 could then monitor the error signals ERROR and after receiving the error signals for all groups in the memory 18, apply control signals on the terminal 40 to instruct the test control circuit 303 to once again access the groups of memory cells containing defective memory cells. When the groups of memory cells containing defective cells are activated for the second time, the control circuit 36 could then control the shift register circuit 38 to serially shift the error signals ERROR1–ERRORN onto the terminal DQ0 where the memory tester 12 may monitor those signals to detect the precise memory cell that is defective. In addition, one skilled in the art will realize the test circuit 302 need not include the shift register 38. Instead, the error signals $\overline{\text{ERROR1}}$–$\overline{\text{ERRORN}}$ can be applied directly to the dynamic compare circuit 304 with the memory tester 12 (FIG. 2) monitoring the signal ERROR on the terminal DQ to detect whether a memory cell in an addressed group is defective. The memory tester 12 may test each group in the memory 18 and store information on any defective groups, and thereafter enter a different test mode where it replaces any defective groups in their entirety using redundant memory cells in the memory 18 as understood by one skilled in the art. Alternatively, the memory tester 12 may perform additional testing in the memory 18 to detect the precise location of the defective cell.

Figure 6:
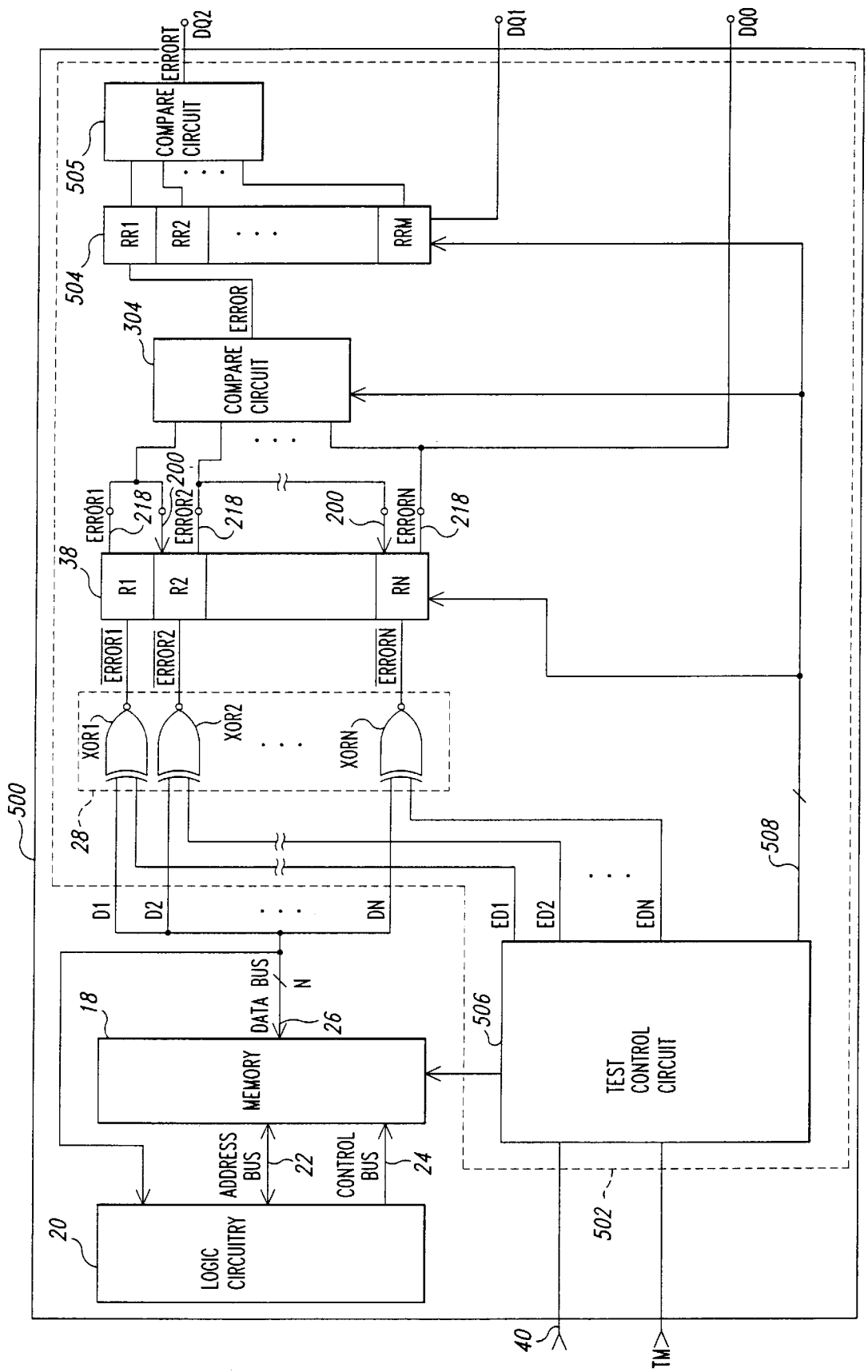
FIG. 6 is a functional block diagram of an Embedded DRAM including a test circuit according to a further embodiment of the present invention.

FIG. 6 is a functional block diagram of an Embedded DRAM 500 including a test circuit 502 according to another embodiment of the present invention. In the test circuit 502, components that are the same as those previously described with reference to the test circuit 302 of FIG. 4 have been given the same reference numbers, and for the sake of brevity will not be described in further detail. The test circuit 502 is identical to the test circuit 302 except for a test control circuit 506, an additional shift register circuit 504, and an additional compare circuit 505. The shift register circuit 504 receives the error signal ERROR developed by the compare circuit 304 and includes a serial output coupled to the data terminal DQ1. The shift register circuit 504 includes a plurality of registers RR1–RRM, where M corresponds to the number of groups of addressed memory cells in the memory 18. For example, where the memory 18 includes a single memory-cell array having 512 columns and 256 rows, the width N of the data bus 26 equals 512, and M equals 256 such that the shift register 504 includes the registers RR1–RR256, one for each row in the memory 18. The shift register circuit 504 is a conventional circuit and well understood by those skilled in the art. In one embodiment, each of the registers RR1–RRM is the same as the register R2 depicted in FIG. 3.

An additional compare circuit 505 receives the signals ERROR stored in the registers RR1–RRM on respective inputs, and develops a total error signal ERRORT on a data terminal DQ2 in response to these error signals. The compare circuit 505 may be identical to the compare circuit 304, and thus activates the signal ERRORT when any of the signals ERROR stored in registers RR1–RRM are active. The control circuit 506 develops the expect data signals ED1–EDN and applies control signals 508 to control the circuits 38, 304, 504, and 505 during testing of the memory 18.

In operation, the memory tester 12 (see FIG. 1) places the test circuit 502 in the test mode by activating the test mode signal TM. In response to the active test mode signal TM, the control circuit 506 operates as previously described to transfer test data into the memory 18. The control circuit 506 thereafter operates as previously described with reference to FIG. 4 such that the compare circuit 304 develops the error signals ERROR corresponding to each group of accessed memory cells in the memory 18. After the compare circuit 304 develops the error signal ERROR for a first group of memory cells, the control circuit 506 applies the control signals 508 to the shift register circuit 504. In response to the control signals 508, the shift register circuit 504 stores the error signal ERROR in the register RR1. The control circuit 506 thereafter accesses a second group of memory cells and controls the circuits 28, 38, and 304 to develop the error signal ERROR corresponding to the second group. The control circuit 506 thereafter controls the shift register circuit 504 to shift the error signal corresponding to the second group into the register RR1 while the error signal previously stored in the register RR1 is shifted into the register RR2. The control circuit 506 repeats this process until the M error signals ERROR corresponding to each group of memory cells have been shifted into the registers RR1–RRM in the shift register circuit 504. At this point, the register RRM stores the error signal ERROR corresponding to the first group, the register RRM–1 stores the signal ERROR corresponding to the second group, and so on with the register RR1 storing the error signal ERROR corresponding to the Mth group.

After the error signals ERROR corresponding to each group of memory cells have been stored in the registers RR1–RRM, the control circuit 506 activates the compare circuit 505 which, in turn, develops the total error signal ERRORT on terminal DQ2. The total error signal ERRORT indicates whether any memory cells in the Embedded DRAM 500 are defective. If the signal ERRORT is inactive, the memory tester 12 knows none of the addressed memory cells is defective, and the Embedded DRAM 500 need be tested no further. When the signal ERRORT is active, however, at least one group contains a defective memory cell and the control circuit 506 may then control the shift register circuit 504 to serially shift the error signals ERROR stored in the registers RR1–RRM onto the data terminal DQ1. The memory tester 12 monitors the error signals ERROR serially placed on the data terminal DQ1 and determines which groups of addressed memory cells in the Embedded DRAM 500 are defective from these error signals. The memory tester 12 may thereafter apply control signals on the terminal 40 to the control circuit 506 causing the control circuit 506 to once again access the groups of memory cells in the memory 18 containing defective memory cells. For each defective group, the control circuit 506 controls the circuits 28 and 38 to store the error signals ERROR1–ERRORN in the shift register circuit 38 corresponding to the defective group, and thereafter shift the error signals ERROR1–ERRORN onto the data terminal DQ0. The memory tester 12 detects the precise defective memory cell within each defective group from the signals ERROR1–ERRORN shifted onto the terminal DQ0. As previously discussed with reference to the test circuit 302 of FIG. 4, the shift register 38 may similarly be omitted in this embodiment.

Figure 7:
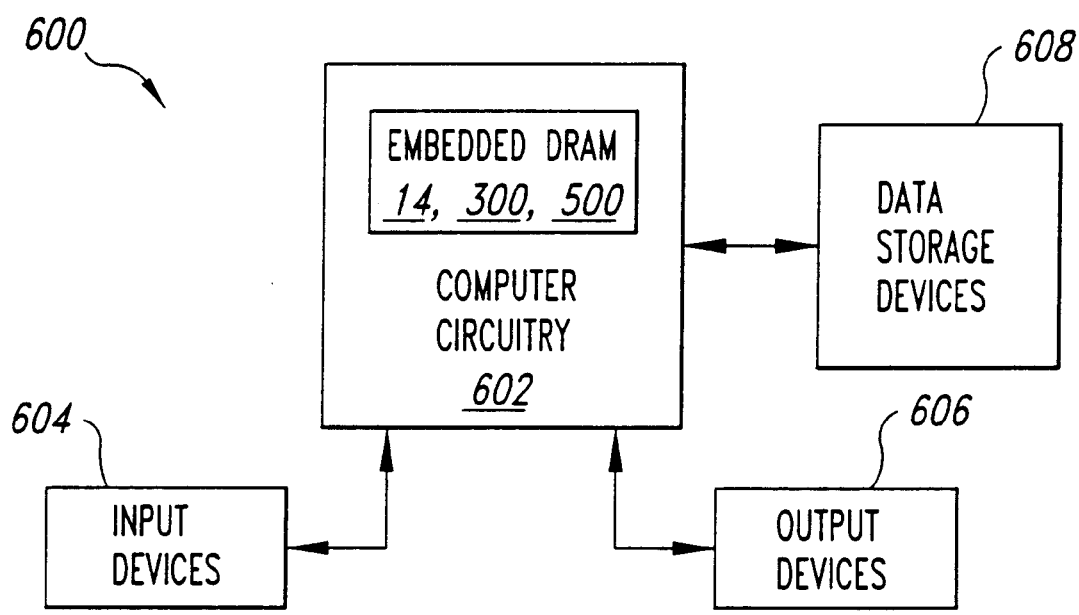
FIG. 7 is a computer system including an Embedded DRAM containing one of the test circuits of FIGS. 2, 4, and 6.

FIG. 7 is a block diagram of a computer system 600 including one of the Embedded DRAMs 14, 300, or 500 previously described with references to FIGS. 2, 4, and 6, respectively. For the following description, it will be assumed the computer system 600 includes the Embedded DRAM 14. The computer system 600 includes computer circuitry 602 for performing various computing functions, such as executing specific software to perform specific calculations or tasks. In the computer system 600, the Embedded DRAM 14 typically has its logic circuitry 20 designed to perform a specific function, such as high-resolution graphics or high-speed communications. In addition, the computer system 600 includes one or more input devices 604, such as a keyboard or a mouse, coupled to the computer circuitry 602 to allow an operator to interface with the computer system 600. Typically, the computer system 600 includes one or more output devices 606 coupled to the computer circuitry 602, such output devices typically being a printer or a video terminal. One or more data storage devices 608 are also typically coupled to the computer circuitry 602 to store data or retrieve data from the external storage media (not shown in FIG. 7). Examples of typical data storage devices 608 include hard and floppy disks, tape cassettes, and compact disk read-only memories ("CD-ROMs").

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

What is claimed is:

1. A test circuit in an embedded DRAM including an arrays of memory cells, a logic circuit, and the test circuit formed in a semiconductor substrate, the test circuit comprising:

a first external terminal adapted to receive at least one test signal;

a comparison circuit including a first plurality of inputs adapted to receive respective read data signals and a second plurality of inputs adapted to receive respective expect data signals, the comparison circuit comparing the binary values of the read and expect data signals and developing an inactive error signal on an output when the compared signals have the same binary values and an active error signal when the compared signals have different binary values;

a storage circuit coupled to the outputs of the comparison circuits, the storage circuit latching the error signals output by the comparison circuits and transferring the latched error signals onto a second external terminal of the embedded DRAM; and a test control circuit coupled to the comparison circuit, the first external terminal, and the storage circuit the test control circuit operable responsive to the at least one test signal being active to apply data from addressed memory cells respectively on the first inputs of the comparison circuit and apply respective expect data on the second inputs of the comparison circuit, and the test control circuit controlling the storage circuit to latch the resulting error signals and thereafter transfer the latched error signals onto the second external terminal.

2. The test circuit of claim 1 wherein the embedded DRAM includes an internal data bus N bits wide and the comparison circuit includes N inputs.

3. The test circuit of claim 1 wherein the comparison circuit develops 512 error signals.

4. The test circuit of claim 1 wherein the comparison circuit includes a plurality of XOR gates each having two inputs and an output.

5. The test circuit of claim 1 wherein the first external terminal is adapted to receive a single logic level signal, and the first and second external terminals comprise the same terminal.

6. The test circuit of claim 1 wherein the storage circuit includes a plurality of storage registers, each storage register comprising:

a first switch circuit having first and second signal terminals, and a control terminal adapted to receive a first shift signal;

a first latch circuit having an input coupled to the second signal terminal of the first switch circuit, and having an output;

a second switch circuit having a first signal terminal coupled to the output of the first latch circuit, a second signal terminal, and a control terminal adapted to receive a second shift signal;

a second latch circuit having an input coupled to the second signal terminal of the second switch circuit an having an output;

a reset switch circuit having signal terminals coupled between a first voltage source and the input of the second latch circuit, and having a control terminal adapted to receive a reset signal;

an input switch circuit having signal terminals coupled between an enable node and the input of the second latch circuit, and having a control terminal adapted to receive the read data signal; and an enable switch circuit having signal terminals coupled between the enable node and a second voltage source, and having a control terminal adapted to receive an enable signal.

7. The test circuit of claim 6 wherein the first, second, input, and enable switch circuits each include an NMOS transistor, and the reset switch circuit includes a PMOS transistor.

8. The test circuit of claim 6 wherein each of the first and second latch circuits include a pair of cross-coupled inverters.

9. A test circuit in an embedded DRAM including an array of memory cells, a logic circuit, and the test circuit formed in a semiconductor substrate, the test circuit comprising:

a first external terminal adapted to receive at least one test signal;

a comparison circuit including a first plurality of inputs adapted to receive respective read data signals and a second plurality of inputs adapted to receive respective expect data signals, the comparison circuit comparing the binary values of the read and expect data signals and developing an inactive error signal on an output when the compared signals have the same binary values and an active error signal when the compared signals have different binary values, the active error signal being transferred onto a second external terminal of the embedded DRAM; and a test control circuit coupled to the comparison circuit and the first external terminal, the test control circuit being operable responsive to the at least one test signal being active to apply data from addressed memory cells respectively on the first inputs of the comparison circuit and apply respective expect data on the second inputs of the comparison circuit, the test control circuit being operable to cause the comparison circuit to transfer the error signal onto the second external terminal.

10. The test circuit of claim 9 wherein the embedded DRAM includes an internal data bus N bits wide and the comparison circuit includes N inputs.

11. The test circuit of claim 9 wherein the comparison circuit develops 512 error signals.

12. The test circuit of claim 9 wherein the comparison circuit includes a plurality of XOR gates each having two inputs and an output.

13. The test circuit of claim 9 wherein the first external terminal is adapted to receive a single logic level signal, and the first and second external terminals comprise the same terminal.

14. A computer system, comprising:

a data input device;

a data output device; and embedded computing circuitry coupled to the data input and output devices, the embedded computing circuitry comprising:

a plurality of external terminals, including first external terminal adapted to receive a test signal, and a second external terminal;

a logic circuit coupled to some of the external terminals and operable to perform a desired function; and a memory device coupled to the logic circuit through internal address, control, and data busses, the memory device comprising:

an address decoder coupled to the address bus, a control circuit coupled to the control bus, a read/write circuit coupled to the data bus, an array coupled to the address decoder and read/write circuit, the array including a plurality of memory cells, and a test circuit, comprising:

a comparison circuit including a first plurality of inputs adapted to receive respective read data signals and a second plurality of inputs adapted to receive respective expect data signals, the comparison circuit comparing the binary values of the read and expect data signals and developing an inactive error signal on an output when the compared signals have the same binary values and an active error signal when the compared signals have different binary values;

a storage circuit coupled to the outputs of the comparison circuits, the storage circuit latching the error signals output by the comparison circuits and transferring the latched error signals onto the second external terminal of the embedded computing circuitry; and a test control circuit coupled to the comparison circuit, the first external terminal, and the storage circuit the test control circuit operable responsive to the at least one test signal being active to apply data from addressed memory cells respectively on the first inputs of the comparison circuit and apply respective expect data on the second inputs of the comparison circuit, and the test control circuit controlling the storage circuit to latch the resulting error signals and thereafter transfer the latched error signals onto the second external terminal.

15. The computer system of claim 14 wherein the memory device includes an internal data bus N bits wide and the comparison circuit includes N inputs.

16. The computer system of claim 14 wherein the comparison circuit develops 512 error signals.

17. The computer system of claim 14 wherein the comparison circuit includes a plurality of XOR gates each having two inputs and an output.

18. The computer system of claim 14 wherein the first external terminal is adapted to receive a single logic level signal, and the first and second external terminals comprise the same terminal.

19. The computer system of claim 14 wherein the storage circuit includes a plurality of storage registers, each storage register comprising:

a first switch circuit having first and second signal terminals, and a control terminal adapted to receive a first shift signal;

a first latch circuit having an input coupled to the second signal terminal of the first switch circuit, and having an output;

a second switch circuit having a first signal terminal coupled to the output of the first latch circuit, a second signal terminal, and a control terminal adapted to receive a second shift signal;

a second latch circuit having an input coupled to the second signal terminal of the second switch circuit an having an output;

a reset switch circuit having signal terminals coupled between a first voltage source and the input of the second latch circuit, and having a control terminal adapted to receive a reset signal;

an input switch circuit having signal terminals coupled between an enable node and the input of the second latch circuit, and having a control terminal adapted to receive the read data signal; and an enable switch circuit having signal terminals coupled between the enable node and a second voltage source, and having a control terminal adapted to receive an enable signal.

20. The computer system of claim 19 wherein the first, second, input, and enable switch circuits each include an NMOS transistor, and the reset switch circuit includes a PMOS transistor.

21. The computer system of claim 19 wherein each of the first and second latch circuits include a pair of cross-coupled inverters.

22. The computer system of claim 14 wherein the logic circuit comprises a microprocessor.

23. A computer system, comprising:

a data input device;

a data output device; and embedded computing circuitry coupled to the data input and output devices, the embedded computing circuitry comprising:

a plurality of external terminals, including first external terminal adapted to receive a test signal, and a second external terminal;

a logic circuit coupled to some of the external terminals and operable to perform a desired function, and a memory device coupled to the logic circuit through internal address, control, and data busses, the memory device including, an address decoder coupled to the address bus, a control circuit coupled to the control bus, a read/write circuit coupled to the data bus, an array coupled to the address decoder and read/write circuit, the array including a plurality of memory cells, and a test circuit, comprising:

a comparison circuit including a first plurality of inputs adapted to receive respective read data signals and a second plurality of inputs adapted to receive respective expect data signals, the comparison circuit comparing the binary values of the read and expect data signals and developing an inactive error signal on an output when the compared signals have the same binary values and an active error signal when the compared signals have different binary values, the active error signal being transferred onto the second external terminal of the embedded computing circuitry; and a test control circuit coupled to the comparison circuit and the first external terminal, the test control circuit being operable responsive to the at least one test signal being active to apply data from addressed memory cells respectively on the first inputs of the comparison circuit and apply respective expect data on the second inputs of the comparison circuit, the test control circuit being operable to cause the comparison circuit to transfer the error signal onto the second external terminal.

24. The computer system of claim 23 wherein the embedded DRAM includes an internal data bus N bits wide and the comparison circuit includes N inputs.

25. The computer system of claim 23 wherein the comparison circuit develops 512 error signals.

26. The computer system of claim 23 wherein the comparison circuit includes a plurality of XOR gates each having two inputs and an output.

27. The computer system of claim 23 wherein the first external terminal is adapted to receive a single logic level signal, and the first and second external terminals comprise the same terminal.

28. The computer system of claim 23 wherein the logic circuit comprises a microprocessor.

29. A method of testing memory cells in an embedded DRAM including an array of memory cells, comprising:
  placing the embedded DRAM in a test mode;
  writing test data to at least some of the memory cells in the array;
  activating a row of memory cells in the array;
  comparing the data stored in a group of memory cells in the activated row, each memory cell in the group having its data compared to a predetermined binary value;
  storing the result of the comparison of each memory cell in the group as a respective error bit;
  comparing at least some of the error bits; and
  placing an active error signal on an external terminal of the embedded DRAM when the step of comparing at least some of the error bits detects at least one of the error bits is true.

30. The method of claim 29 wherein the group includes each memory cell in the activated row.

31. The method of claim 29 wherein the data stored in another group of memory cells in the activated row is compared while sequentially transferring the error bits associated with the previous group onto the external terminal.

32. A method of testing memory cells in an embedded DRAM including an array of memory cells, comprising:
  placing the embedded DRAM in a test mode;
  accessing a group of memory cells in the array;
  comparing the data stored in each of the memory cells in the group to an associated predetermined binary value;
  storing the results of each of the comparisons as a respective error bit; and
  transferring the error bits sequentially onto an external terminal of the embedded DRAM.

33. The method of claim 32 wherein another group of memory cells is accessed while the step of transferring is transferring the error bits associated with the previous group sequentially onto the external terminal.

34. The method of claim 32 wherein the predetermined binary values associated with all the memory cells are equal.

35. The method of claim 32 wherein accessing a group of memory cells includes activating a row of memory cells and comparing the data stored includes comparing the data stored in all the memory cells in the activated row.

36. The method of claim 32 wherein the error bits are portioned into groups, and the error bits in each group are sequentially transferred in parallel onto respective, external terminals.

* * * * *

UNITED STATES PATENT AND TRADEMARK OFFICE
CERTIFICATE OF CORRECTION

PATENT NO. : 6,484,278 B1
DATED : November 19, 2002
INVENTOR(S) : Todd A. Merritt, Donald M. Morgan and Huy Thanh Vo It is certified that error appears in the above-identified patent and that said Letters Patent is hereby corrected as shown below:

<u>Title page,</u>
Item [56], References Cited, U.S. PATENT DOCUMENTS,
"5,367,490    11/1994" should read -- 5,367,492   11/1994 --
"Kawamotot et al." should read -- Kawamoto et al. --

Item [57], ABSTRACT,
Line 9, "develops and inactive" should read -- develops an inactive --
Line 18, "test mode termninal," should read -- test mode terminal, --

<u>Column 5,</u>

Line 64,  "$\overline{ERROR2}$" should read -- $\overline{ERROR\ 2}$ --

Line 65, "$\overline{ERROR\ 2}$ ." should read   --$\overline{ERROR\ 2}$.--

<u>Column 7,</u>
Line 23, "conesponding" should read -- corresponding --

<u>Column 8,</u>
Line 41, "error signal" should read -- error signals --

<u>Column 9,</u>
Line 11, "RESET" should read   --$\overline{RESET}$--

<u>Column 14,</u>
Line 48, "including first external" should read -- including a first external --

UNITED STATES PATENT AND TRADEMARK OFFICE
CERTIFICATE OF CORRECTION

PATENT NO.    : 6,484,278 B1
DATED         : November 19, 2002
INVENTOR(S)   : Todd A. Merritt, Donald M. Morgan and Huy Thanh Vo It is certified that error appears in the above-identified patent and that said Letters Patent is hereby corrected as shown below:

Column 15,
Line 16, "age circuit the test control" should read -- age circuit, the test control --
Line 53, "switch circuit an" should read -- switch circuit and --

Column 16,
Line 17, "including first external" should read -- including a first external --

Signed and Sealed this

Twenty-fifth Day of November, 2003

JAMES E. ROGAN
*Director of the United States Patent and Trademark Office*